United States Patent [19]

Hirayama et al.

[11] Patent Number: 5,608,230

[45] Date of Patent: Mar. 4, 1997

[54] STRAINED SUPERLATTICE SEMICONDUCTOR PHOTODETECTOR HAVING A SIDE CONTACT STRUCTURE

[75] Inventors: Yoshiyuki Hirayama; Kazuaki Nishikata; Michinori Irikawa, all of Yokohama, Japan

[73] Assignee: The Furukawa Electric Co., Ltd., Tokyo, Japan

[21] Appl. No.: 290,918

[22] PCT Filed: Dec. 21, 1993

[86] PCT No.: PCT/JP93/01848

§ 371 Date: Nov. 18, 1994

§ 102(e) Date: Nov. 18, 1994

[87] PCT Pub. No.: WO94/15367

PCT Pub. Date: Jul. 7, 1994

[30] Foreign Application Priority Data

Dec. 21, 1992 [JP] Japan ................................. 4-356786
Apr. 7, 1993 [JP] Japan ................................. 5-105091

[51] Int. Cl.⁶ ..................... H01L 29/06; H01L 31/0328; H01L 31/0336
[52] U.S. Cl. ................. 257/18; 257/21; 257/184; 257/190
[58] Field of Search ..................... 257/18, 21, 96, 257/103, 184, 189, 190

[56] References Cited

U.S. PATENT DOCUMENTS

| 5,132,981 | 7/1992 | Uomi et al. | 257/18 |
| 5,155,738 | 10/1992 | Ijichi et al. | 257/18 |
| 5,238,869 | 8/1993 | Shichijo et al. | 437/126 |

FOREIGN PATENT DOCUMENTS

| 60-195981 | 10/1985 | Japan . | |
| 60-262473 | 12/1985 | Japan . | |
| 61-152081 | 7/1986 | Japan | 257/18 |
| 62-216378 | 9/1987 | Japan . | |
| 63-098158 | 4/1988 | Japan . | |
| 63-80520 | 4/1988 | Japan | 257/18 |
| 2-199877 | 8/1990 | Japan . | |
| 04-106984 | 4/1992 | Japan . | |

OTHER PUBLICATIONS

Fritz et al., "Novel relectance modulator employing an InGaAs/AlGaAs strained–layer superlattice Fabry–Perot cavity with unstrained InGaAs/InAlAs mirrors," Appl. Phys. Lett., vol. 58, No. 15, 15 Apr. 1991, pp. 1608–1610.

Primary Examiner—Sara W. Crane
Attorney, Agent, or Firm—Jacobson, Price, Holman & Stern, PLLC

[57] ABSTRACT

There is provided an MSM type semiconductor photodetector having a strained superlattice structure that shows a high responsiveness and, at the same time, a reduced dark current. Such a strained superlattice semiconductor photodetector comprising semiconductor layers including a photodetective layer having an intra-planar compressive strain type strained superlattice layer formed on a semiconductor substrate by epitaxial growth is characterized in that the epitaxially grown layers are partly removed from the side walls of the semiconductor layers to produce cut-out sections (grooves 8a, 8b) and arranging electrodes in said cut-out sections respectively. Consequently, the fast responsiveness of the semiconductor photodetector is remarkably improved and the dark current of the device is greatly reduced.

4 Claims, 2 Drawing Sheets

5,608,230

STRAINED SUPERLATTICE SEMICONDUCTOR PHOTODETECTOR HAVING A SIDE CONTACT STRUCTURE

BACKGROUND OF THE INVENTION

1. Field of the Invention

This invention relates to an improved strained superlattice semiconductor photodetector having a side contact structure.

2. Prior Art

While PIN type semiconductor photodetectors having pn junctions have been used in practical applications, Metal-Semiconductor-Metal (MSM) type semiconductor photodetectors realized by utilizing Schottky junctions have been attracting researchers' attention.

Since an MSM type semiconductor photodetector comprising a pair of oppositely disposed electrodes on a crystal surface is particularly suited for use in a highly integrated circuit such as an OEIC (opto-electronic integrated circuit), a number of studies have been made in this technological field.

While an MSM type semiconductor photodetector has advantages of having a very small capacity and being structurally simple and therefore capable of being produced with a reduced number of manufacturing steps, it has certain technological problems to be solved before it can make a feasible opto-electronic device, including a relatively large dark current that has to be reduced and a relatively long rise time of the responding pulse that needs to be curtailed in order to achieve a fast pulse response.

A long rise time of the responding pulse of an MSM type semiconductor photodetector is attributable to the fact that holes generated as a result of optical absorption move rather slowly so that they tend to get to the cathode considerably long after the end of light exposure.

The use of a strained superlattice has been proposed as means for accelerating holes in order to eliminate the above identified technological problems.

This proposal is based on the fact that, if a semiconductor photodetector has a strained superlattice structure, the effective mass of holes in the strained superlattice layer having intra-planar compressive strains of the device is reduced along intra-planar directions to enhance the mobility of holes, when compared with a device having no strained structure.

FIG. 4 illustrates a typical MSM type semiconductor photodetector realized by utilizing a strained superlattice structure.

Referring to FIG. 4, a nondoped InP buffer layer 12, a photodetective layer 13 having a strained superlattice structure and comprising an InGaAs compressive strain layer and an InGaAs tensile strain layer, a non-doped InAlAs layer and Ti/Pt/Au electrodes are sequentially laid on a (100) Fe-doped InP substrate 11.

An MSM type semiconductor photodetector having a strained superlattice structure as shown in FIG. 4 is accompanied by the following problems when it is used for a practical application.

(1) After moving in parallel with an intra-planar direction in the strained superlattice structure, carriers move perpendicularly relative to the strained superlattice until they get to an electrode.

In other words, their responsiveness is degraded as they pass over a barrier layer of the strained superlattice (and they give rise to a pile up phenomenon at a heterobarrier).

(2) Carriers are generated by incident light in both the compressive and tensile strained superlattice layers and caused to move toward an electrode in the two strained superlattice layers. While holes behave as lightweight holes in the compressive strained superlattice layer, they remain as heavyweight holes in the tensile strained superlattice layer so that the speed at which they move cannot be significantly improved as a whole.

(3) An increased leak current appears from any reversely biased Schottky junctions to increase the dark current of the device because of a low Schottky barrier between each electrode and a semiconductor on the InP substrate of the device.

SUMMARY OF THE INVENTION

In view of the above identified technological problems, it is therefore an object of the present invention to provide an MSM type semiconductor photodetector having a strained superlattice structure that shows a high responsiveness and, at the same time, a reduced dark current.

According to the invention, the above object is achieved by providing a strained superlattice semiconductor photodetector comprising semiconductor layers including a photodetective layer having an intra-planar compressive strain type strained superlattice layer formed on a semiconductor substrate by epitaxial growth characterizeid in that it has a side contact structure formed by removing part of the epitaxially grown layers from the side walls of the semiconductor layers to produce cut-out sections and arranging electrodes in said cut-out sections, respectively.

Preferably, a semiconductor photodetector according to the invention is partly or entirely configured with any of the following features.

Firstly, the epitaxially grown layers are partly removed to produce grooves at lateral sides of the photodetective layer having a strained superlattice layer and electrodes are arranged in said grooves respectively and/or the electrodes arranged at the lateral sides of the photodetective layer have a Schottky junction and/or one or more than one Schottky electrodes are arranged on lateral sides of the photodetecting layer having a strained superlattice layer by way of a multiquantum barrier structure.

Secondly, the photodetective layer having a strained superlattice layer comprises an optically absorbent intra-planar compressive strain type quantum well layer and an optically nonabsorbent intra-planar tensile strain type quantum barrier layer and the quantum well layer and the quantum barrier layer have respective strain factors that are substantially equal to each other for the intra-planar compressive strain and the intra-planar tensile strain.

Preferably, the quantum well laser is made of mixed crystal of InGaAs(P) or InGaAs(Sb) having an strain factor of not greater than 3% for the intra-planar compressive strain and a energy band gap width of not greater than 1.42 eV and the quantum barrier layer is made of mixed crystal of InGaAs(P) or Al(Ga) InAs having an strain factor of not greater than 3% for the intra-planar tensile strain and an energy band gap width of not greater than 0.75 eV.

Since the epitaxially grown layers of a semiconductor photodetector according to the invention are partly removed to form cut-out sections in the side walls of the semiconductor layers and electrodes are arranged in the cut-out sections, respectively, carriers are not required to pass over a barrier layer so that no pile-up phenomenon is given rise to at a heterobarrier. Consequently, carriers can move at an enhanced speed to improve the fast responsiveness of the semiconductor photodetector.

If, at least one of the electrodes of a semiconductor photodetector according to the invention is of the Schottky type and the Schottky junction of the electrode is arranged by way of a multiquantum barrier structure, the effective Schottky barrier becomes high to reduce any leak current to consequently reduce the dark current of the device.

If a semiconductor photodetector according to the invention comprises an optically absorbent layer that is a quantum well layer having compressive strain and a barrier layer that is made of a material transparent with regard to incident light, holes move in an intra-planar direction of the strained superlattice structure as light-weight holes to consequently enhance the responsiveness of the semiconductor photodetector.

DESCRIPTION OF THE PREFERRED EMBODIMENTS

Now, the present invention will be described by referring to the accompanying drawings that illustrates a preferred embodiment of the invention.

Figure 1:
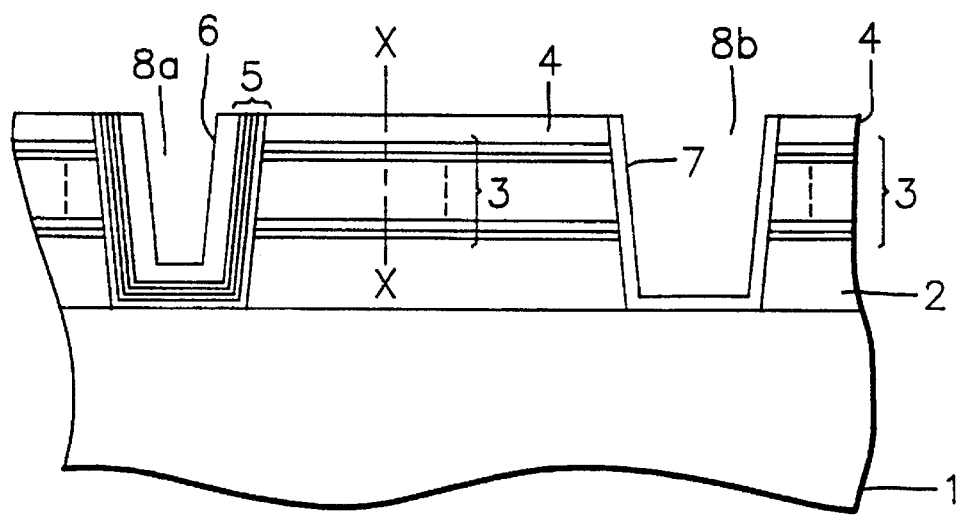
FIG. 1 is a schematic partial sectional view of an semiconductor photodetector according to the invention.

FIG. 1 is a schematic partial sectional view of a preferred embodiment of the invention. Referring to FIG. 1, a 0.5 μm thick InAlAs buffer layer 2, a superlattice photodetective layer 3 and a 300 Å thick InAlAs cap layer 4 that lattice-matches with InP are sequentially formed on a semiconductor (semi-insulating) substrate 1 made of InP.

The superlattice photodetective layer 3 is of a strained superlattice structure having a thickness of 0.5 μm to 1.0 μm.

The strained superlattice structure of the photodetective layer 3 is made of $In_{0.68}Ga_{0.32}As$ (100 Å thick) having compressive strain and $In_{0.37}Al_{0.63}As$ (100 Å thick) having tensile strain and so designed that the structure appears to have no strain at all as a whole as the compressive strain and the tensile strain are mutually off set.

In FIG. 1, 5 is a multiquantum barrier layer made of InAlAs-InGaAs(P) and 6 is a Schottky electrode ms de of Ti-Pt-Au, whereas 7 is an ohmic electrode made of Au-Ge-Ni.

The ohmic electrode may alternatively be produced by forming InAlAs in one of the grooves of the photodetective layer 3 and then a Schottky electrode thereon.

Figure 2:
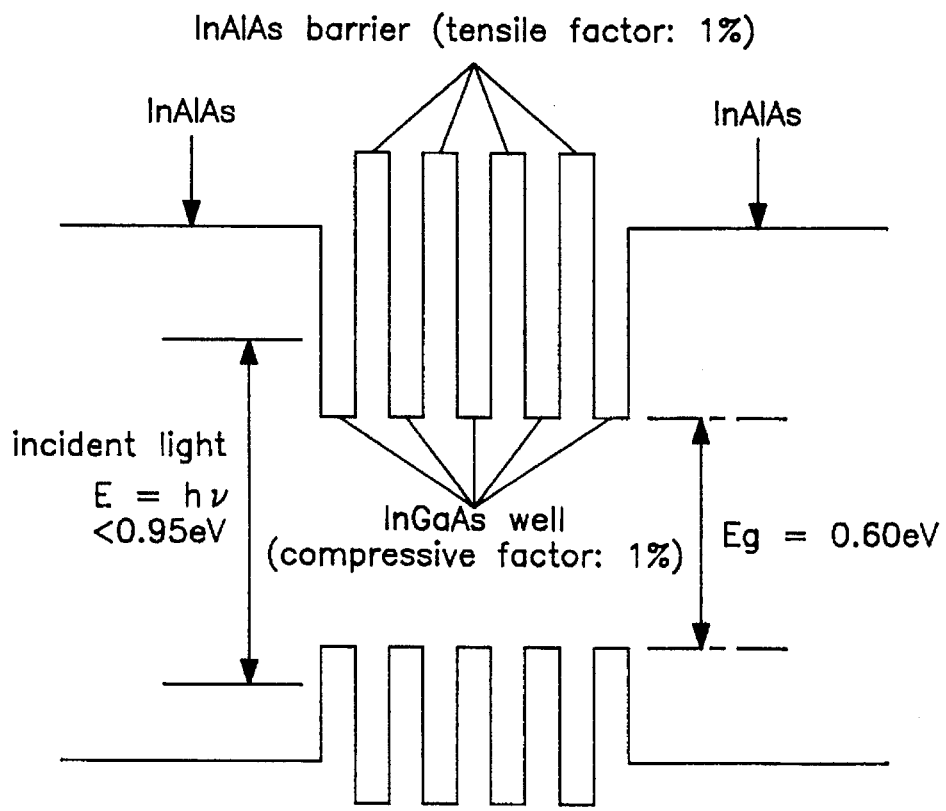
FIG. 2 is a band diagram of the embodiment of FIG. 1 taken along line X—X.

FIG. 2 shows a band diagram of the embodiment of FIG. 1 taken along line X—X.

Referring to FIG. 2, the InGaAs wall layer with a compressive strain factor of 1% has a band gap Eg of approximately 0.60 eV.

If the well layer has a thickness not smaller than 40 Å, its absorption edge energy including the quantum confinement effect is not greater than 0.84 eV and can absorb light having a wavelength of 1.55 μm.

The InAlAs barrier layer with a tensile strain factor of 1% doesn't normally absorb light having a wavelength between 1.3 and 1.65 μm which is normally used for optical telecommunications.

By combining a compressive strain type well layer and a tensile strain type barrier layer, a sufficiently thick photodetective layer may be formed without any particular problem as the stress of the compressive strain and that of the tensile strain are mutually offset. Since incident light is absorbed only by the compressive strain type well layer, carriers are made to move in the well layer only in an intra-planar direction of the layer.

Figure 3A:
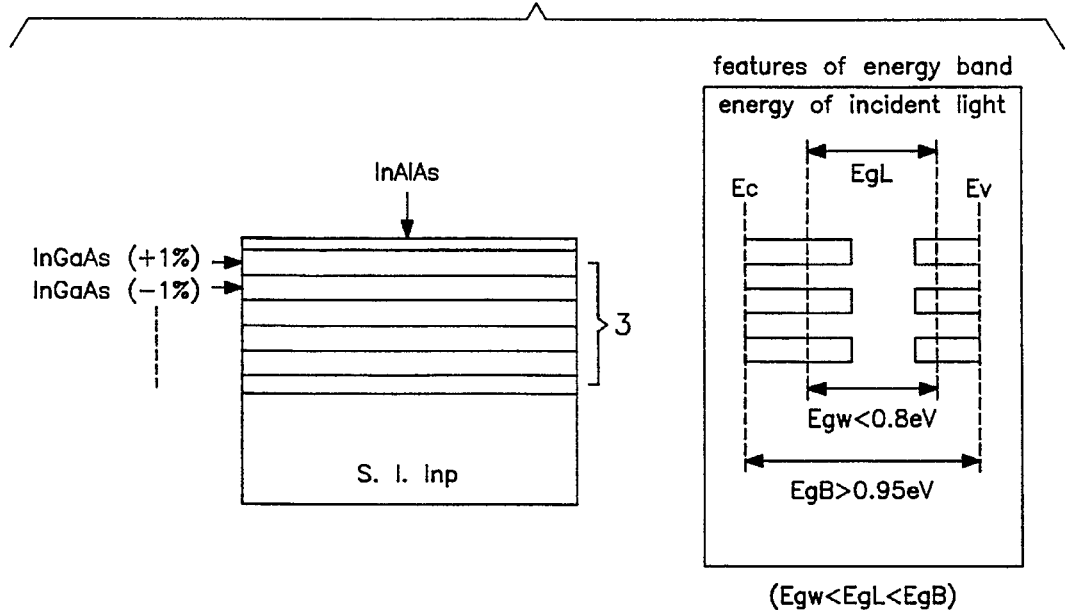
FIGS. 3(A) and 3(B) are illustrations showing, for comparison, the relationship between the energy level of incident light and that of the absorption edge of the photodetective layer (well layer, barrier layer) of a semiconductor photodetector according to the invention and that of a conventional semiconductor photodetector.
Figure 3B:
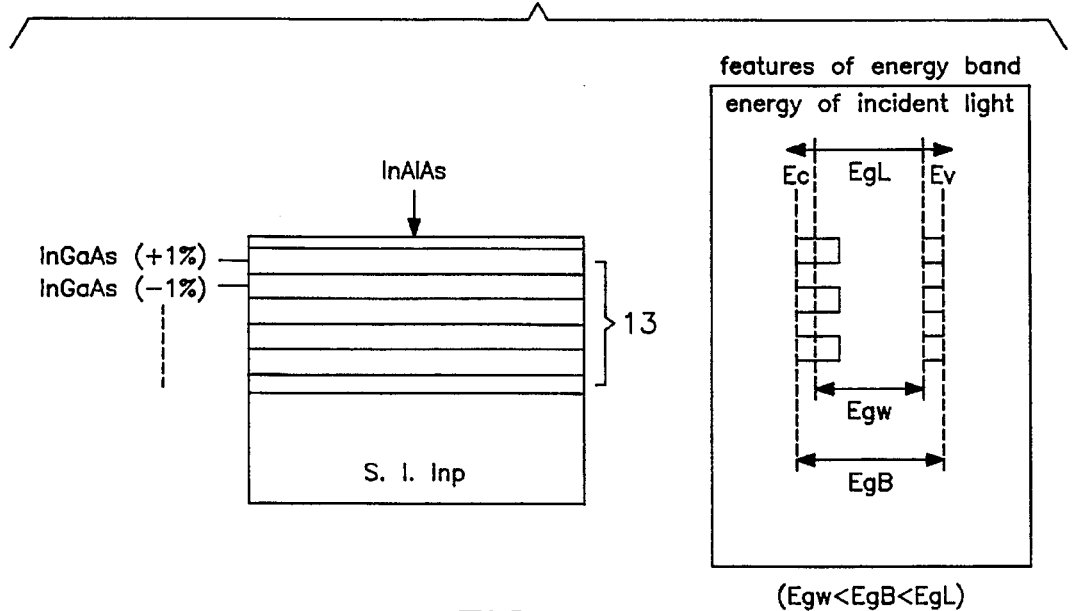
Figure 4:
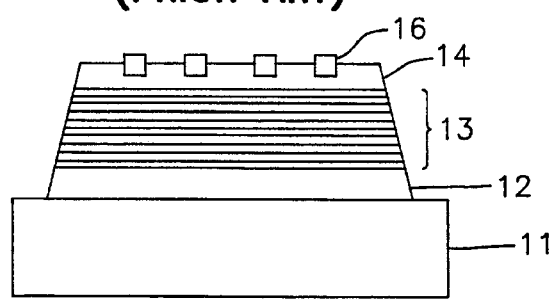
FIG. 4 is a schematic partial sectional view of a conventional semiconductor photodetector.

FIGS. 3(A) and 3(B) show for comparison the relationship between the energy level of incident light and that of the absorption edge of the photodetective layer 3 (well layer, barrier layer) of a semiconductor photodetector according to the invention and that of a conventional semiconductor photodetector.

Referring to FIGS. 3(A) and 3(B) a semiconductor photodetector according the invention and satisfying a relationship of $E_{gW}<E_{gL}<E_{gB}$ is obviously superior to a conventional semiconductor photodetector showing a relationship of $E_{gW}<E_{gB}<E_{gL}$ in terms of fast responsiveness and reduced dark current.

A semiconductor photodetector according to the invention can typically be prepared by following the steps as described below.

Firstly, an InAlAs buffer layer 2, a photodetective layer 3 and a cap layer 4 are sequentially formed on an InP semiconductor substrate by epitaxial growth.

Then, a pair of grooves 8a, 8b having a frustoconical sectional view are cut across the layers, the photodetective layer 3 being at least cut through.

Thereafter, the negative and positive electrodes are arranged at respective predetermined positions of the device.

Before arranging a negative electrode, a multiquantum barrier layer 5 is formed on the inner surface of the groove 8a by means of ALE (atomic layer epitaxy) described in Document 1 listed below. Then, a Ti-Pt-Au Schottky electrode 6 is formed on the multiquantum barrier layer 5 by selective vapor deposition using the technique of photolithography.

Document 1: Appl. Phys. Lett., 56 (1990) 289

The positive electrode is an Au-Se-Ni ohmic electrode 7 formed on the inter surface of the groove 8b by vapor deposition using a known technique. The ohmic electrode 7 may be replaced by a Schottky electrode realized by forming InAlAs on the inner surface of the groove 8b by vapor deposition using ALE or some other known technique.

Schottky metals that may be used for the Schottky electrode include Ti-Pt-Au and Mo-Ti-Pt-Au.

The overall configuration of a semiconductor photodetector according to the invention is not limited to the one de scribed above and may be modified appropriately without departing the scope of the invention. Some of such possible modifications will be described below.

The semiconductor (semi-insulating) substrate may alternatively be made of a GaAs type material.

Materials that can be used for the strained superlattice structure include substances containing four elements such as InCaAlAs and InCaAsP.

The buffer layer may be made of a superlattice layer or InP, whereas the multiquantum barrier layer may be made of InAlAs-InGaAs (P) disclosed in Document 2 listed below.

Document 2: Jpn. J. Appl. Phys., 31 (1992) L1351

While the band gap of the quantum layer of the strained superlattice structure of the photodetective layer has an upper limit of 1.42 eV, it is preferably not greater than 0.8 eV.

The bad gap of the quantum barrier layer should not coincide with the wavelength of light to be absorbed by the device and preferably not smaller than 1.0 eV.

[Industrial Applicability]

Since a semiconductor photodetector according to the invention has, among others, the following advantages, it can advantageously be used for optical telecommunications.

(1) In a strained superlattice semiconductor photodetector comprising semiconductor layers including a photodetective layer having an intra-planar compressive strain type strained superlattice layer formed on a semiconductor substrate by epitaxial growth, the responsiveness of the device is remarkably improved since the epitaxially grown layers are partly removed from the side walls of the semiconductor layers to produce cut-out sections and electrodes are arranged in said cut-out sections, respectively.

(2) Since the epitaxially grown layers are partly removed to produce grooves at lateral sides of the photodetective layer having a strained superlattice layer and electrodes are arranged in said grooves respectively and/or the electrodes arranged at the lateral sides of the photodetective layer have a Schottky junction and/or one hah one Schottky electrodes are arranged on lateral sides of the photodetecting layer having a strained superlattice layer by way of a multiquantum carrier structure, the effective Schottky barrier of the device has an increased barrier height to reduce any leak current to consequently reduce the dark current of the device.

(3) Since the photodetective layer having a strained superlattice layer comprises an optically absorbent intra-planar compressive strain type quantum well layer and an optically nonabsorbent intra-planar tensile strain type quantum barrier layer and holes move along an intra-planar direction of the strained superlattice structure only as lightweight holes, the fast responsiveness of the device is further improved.

What is claimed is:

1. A strained supperlattice semiconductor photodetector comprising semiconductor layers including a photodetective layer having an intra-planar compressive strain type strained superlattice layer formed on a semiconductor substrate by epitaxial growth, wherein the epitaxially grown layers are partly removed to produce grooves at lateral sides of the photodetective layer having a strained superlattice layer and electrodes are arranged in said grooves respectively, and wherein one or more of said electrodes are Schottky electrodes arranged on lateral sides of the photodetective layer by way of a multiquantum barrier structure.

2. A strained superlattice semiconductor photodetector according to claim 1, wherein the photodetective layer having a strained superlattice layer comprises an optically absorbent intra-planar compressive strain type quantum well layer and an optically nonabsorbent intra-planar tensile strain type quantum barrier layer and the quantum well layer and the quantum barrier layer have respective strain factors that are substantially equal to each other for the intra-planar compressive strain and the intra-planar tensile strain.

3. A strained superlattice semiconductor photodetector according to claim 2, wherein the quantum well layer is made of mixed crystal of $In_xGa_{1-x}As_yP_{1-y}$ having an strain factor of not greater than 3% for the intra-planar compressive strain and a energy band gap width of not greater than 1.42 eV and the quantum barrier layer is made of mixed crystal of $In_xGa_{1-x}As_yP_{1-y}$ having an strain factor of not greater than 3% for the indra-planar tensile strain and an energy band gap width of not greater than 0.75 eV.

4. A strained superlattice semiconductor photodetector according to claim 2, wherein the quantum well layer is made of mixed crystal of $In_xGa_{1-x}As_ySb_{1-y}$ having an strain factor of not greater than 3% for the intra-planar compressive strain and a energy band gap width of not greater than 1.42 eV and the quantum barrier layer is made of mixed crystal of $In_xAl_yGa_{1-x-y}As$ having an strain factor of not greater than 3% for the intra-planar tensile strain and an energy band gap width of not greater than 0.75 eV.

* * * * *